(12) United States Patent
dos Santos Pereira Ribeiro

(10) Patent No.: US 6,255,007 B1
(45) Date of Patent: Jul. 3, 2001

(54) LAMINATE SYSTEM, A PROCESS FOR THE PRODUCTION THEREOF AND USE THEREOF

(75) Inventor: Carlos Antonio dos Santos Pereira Ribeiro, Albstadt Lautlingen (DE)

(73) Assignee: Hartec Gesellschaft fur Haststoffe Und Dunnschichttechnik mbH & Co. KG (DE)

( * ) Notice: Subject to any disclaimer, the term of this patent is extended or adjusted under 35 U.S.C. 154(b) by 0 days.

(21) Appl. No.: 09/216,678

(22) Filed: Dec. 18, 1998

(30) Foreign Application Priority Data

Dec. 18, 1997 (DE) ............................. 197 56 588

(51) Int. Cl.⁷ .................................... C23C 20/08
(52) U.S. Cl. ...................... 428/698; 428/472.2; 428/432; 428/469; 428/697
(58) Field of Search ................... 428/698, 697, 428/701, 702, 432, 469, 472, 472.2

(56) References Cited

U.S. PATENT DOCUMENTS 3,803,057 * 4/1974 Wasa et al. .
4,965,140 * 10/1990 Sarin .
5,266,389 * 11/1993 Omori et al. .
5,700,551 * 12/1997 Kukino et al. .

FOREIGN PATENT DOCUMENTS 284 854 A1   10/1988   (EP) .
448 720 A1   10/1991   (EP) .
592 986 A1   4/1994    (EP) .

OTHER PUBLICATIONS

Masaki, A., et al., *Mold For Molding Optical Glass Element*, 1998 (No Month).
Knotek et al., "The Structure And Composition of TI–ZR–N, TI–AL–ZR–N and TI–AL–V–N Coatings", *Material Science and Engineering*, A105/106, 481–488; 1988 (No Month).
JP 05 266519A, Patent Abstracts of Japan, vol. 18, No. 42, 1993 (No Month).

* cited by examiner

*Primary Examiner*—Deborah Jones
*Assistant Examiner*—Jennifer McNeil
(74) *Attorney, Agent, or Firm*—Morgan & finnegan, LLP

(57) ABSTRACT

In a system based on aluminum, zirconium and nitrogen at least one layer has covalent bonds of aluminum nitride or at least one layer has bonds of the aluminum nitride and zirconium nitride type. In a process for producing such a system an electrical gas discharge is fired in a vacuum chamber such as essentially to form a noble gas-enriched plasma resulting in ionization of the metal elements. To form the nitridic layer nitrogen is continuously fed as a reactive gas into the vacuum chamber and pumped away so as to set a reactive gas partial pressure which is used for process control purposes. The use of such a system for producing a coating on a surface is also described.

8 Claims, No Drawings

LAMINATE SYSTEM, A PROCESS FOR THE PRODUCTION THEREOF AND USE THEREOF

FIELD OF THE INVENTION

The invention relates to a laminate system based on aluminum, zirconium and nitrogen, a process for the production of that laminate system by a deposit procedure, and the use of the laminate system.

BACKGROUND OF THE INVENTION

It is known for titanium nitride coatings to be applied to injection molding tools for the injection molding of plastic materials, in order to reduce the level of coating deposit thereon, to improve the ease with which moldings can be removed from the molding tools, and to reduce the amount of tool wear. It has been found however that those titanium nitride coatings are often not satisfactory in regard to their properties.

Coatings which are found to be an improvement in comparison with such titanium nitride coatings, in terms of the surface properties thereof, are those which contain chromium nitride as an essential constituent thereof. Chromium nitride-bearing coatings however suffer from the disadvantage that the most important properties thereof tend to partially vary during the service life of the molding tools, for example when assembling or vulcanizing rubber parts in which the chromium nitride coatings lose their adhesion-inhibiting effect after a short period of operation.

It is also known that zirconium nitride coatings can be applied to articles in some cases as decorative coatings, by virtue of their brass colorations. Those coatings admittedly in themselves form a hard surface and are chemically resistant to lyes, but they have in particular metal bonds.

Reference may be made to EP-A-0 603 486 describing a multi-stage process for coating cutting and shaping tools with ternary hard-material layer assemblies or laminate structures such as titanium aluminum nitride, zirconium aluminum nitride or chromium aluminum nitride. Although those layer materials are admittedly suitable for tools for metal machining, they cannot however be used to real effect for reducing contact adhesion and for enhancing the chemical resistance of sensitive surfaces such as for example plastic material extrusion tools which are polished to a high state of shine.

With those materials the solid laminate components involve predominantly metal bonds, in which respect thorough and extensive scientific tests have demonstrated that all materials involving a predominantly metal bonding effect have a tendency to suffer from contact adhesion to a greater or lesser degree.

SUMMARY OF THE INVENTION

An object of the present invention is to provide a laminate system which can at least markedly reduce the tendency to adhesion thereof and the degree of deposit coating formation.

Another object of the present invention is to provide a layer or laminate system which can afford a high level of corrosion resistance and an enhanced degree of resistance to abrasion wear.

A further object of the present invention is to provide a laminate system which enjoys an enhanced surface quality in terms of reliability of manufacture, productivity and use-friendliness.

Yet another object of the present invention is to provide a laminate system which enjoys a low level of surface friction and an improved release effect for example for the release of a molding from the surface thereof.

Still a further object of the present invention is a process for the production of a laminate system which is simple to implement and reliable in terms of the production results.

Still another object of the present invention is to provide for the use of a laminate system on a workpiece such as to impart improved qualities and properties thereto.

In accordance with the principles of the present invention, in a first aspect, the foregoing and other objects are attained by a layer or laminate system based on aluminum, zirconium and nitrogen, wherein at least one layer of the system has covalent bonds of aluminum nitride or aluminum nitride and zirconium nitride.

It has been found in that respect that in accordance with the invention the addition of zirconium nitride affords stabilization in respect of the covalent aluminum nitride bond, whereby it is possible to achieve a high level of chemical resistance. The choice of the chemical composition adopted and the further alloying elements is effected depending on the respective properties required, in particular for example in terms of minimizing adhesive forces upon coming into contact with materials which have a tendency to adhere, more especially plastic materials such as thermosetting materials, thermoplastic materials, elastomers, resins, adhesives, rubber, caoutchouc, glass or aluminum.

The improved properties of a minimal tendency to adhesion, chemical resistance in relation to lyes, the low coefficient of friction and the high level of resistance to wear afford components and members such as molds which are provided with such coatings or laminate systems significantly higher levels of surface quality in regard to manufacturing reliability, productivity and user-friendliness.

A preferred feature in accordance with the invention is for the atomic ratio between aluminum and zirconium to be set at 1 or smaller, as that can greatly enhance the adhesive qualities of the coating according to the invention.

In a preferred aspect of that feature the ratio between aluminum and zirconium is between 0.5 and 0.7, whereby the adhesion-inhibiting properties of the system according to the invention, in relation to coating deposits thereon, can be greatly enhanced.

An advantage of the laminate coating system according to the invention in that respect is that it is optically transparent or at least partially translucent and/or electrically non-conductive or at least has a high specific electrical resistance.

In accordance with a further embodiment the layer includes bonds of the aluminum nitride and zirconium nitride type, wherein desirably the atomic ratio between aluminum and zirconium is 1 or less. Preferably the atomic ratio between aluminum and zirconium is 0.5 or less, in particular between 0.25 and 0.45, whereby the level of wear resistance can be substantially enhanced and in particular it is possible to afford a high level of chemical resistance on the part of a coating produced in that way.

In accordance with a preferred feature the coatings afforded by the laminate system according to the invention are of a thickness of at least 50 nm. In accordance with a preferred embodiment the coating is at least between 200 nm and 2 $\mu$m thick for for example optical uses and to satisfy the high demands in terms of surface quality or between 2 $\mu$m and 6 $\mu$m for example for uses in plastic material processing, to avoid unwanted adhesion and coating deposit formation. Even a thickness of over 6 μm with an additional abrasive loading on the coated surface is possible.

In accordance with the invention it is possible to adjust the ohmic resistance of the coating according to the invention by suitable selection of the nitrogen component. Layers with a high proportion of nitrogen have a high level of such resistance and thus a low level of conductivity, whereas layers with a lower level of resistance have a nitrogen content which is lower than the proportion of aluminum. In a preferred embodiment with a very low level of ohmic resistance the layer or layers essentially comprise or comprises pure aluminum or contains or contain at least practically no nitrogen. Conversely, in the case of coatings with a high level of ohmic resistance, the layer or layers at least predominantly comprises or comprise covalent bonds of aluminum nitride and zirconium nitride.

In accordance with the invention, for the purposes of increasing resistance to wear or chemical resistance, it can be provided that at least two coatings are respectively arranged alternately, with layers with a high proportion of nitrogen and layers with a low proportion of nitrogen being deposited one upon the other. An advantage of such a configuration is the combination of different ones of the above-mentioned properties in a laminate or layer system.

In that respect, the layer with a low level of ohmic resistance can comprise a material which is a very good electrical conductor, in particular gold, copper or pure aluminum. Conversely the layer with a high level of ohmic resistance can predominantly comprise an alloy based on aluminum or plastic material or silicon or oxygen.

It will be appreciated that it is provided in accordance with the invention that the coatings are arranged not alternately but in a random sequence in dependence on the aims envisaged. Thus, one or more layers with a high level of ohmic resistance can be followed by one or more layers with a low level of ohmic resistance. An advantage of such a configuration is for example the possibility of producing sensor-action surfaces which for example with progressively increasing wear gain in electrical conductivity or ohmic resistance. A further advantage in this respect is the possibility of selective or partial deposition of the coatings according to the invention for example on semiconductors for the production of conductor tracks and on ceramic or metal bodies as sensor heads.

Depending on the desired purpose the invention further provides that the thicknesses of the individual layers of the structure relative to each other may be varied.

In accordance with the principles of the present invention in a further aspect the foregoing and other objects are attained by a process for the production of a laminate system by deposit thereof, wherein an electrical gas discharge is fired to form a plasma enriched with noble gas, for ionization of the aluminum and/or zirconium of the laminate system, in a vacuum chamber. To form the nitrides of the aluminum and/or zirconium nitrogen is continuously supplied and removed to adjust the reactive gas partial pressure as a regulatable parameter for process control.

The nitrogen gas can be continuously supplied and removed by means of a vacuum pump.

Reactive gases which can be used in accordance with the invention include gases containing boron, silicon, carbon, oxygen and nitrogen and mixtures thereof and mixtures with further gases such as for example nitrogen with ethane and/or silane and/or diborane and/or acetylene, or nitrogen with carbon dioxide. Preferably the gases, reactive and noble gas, are already in the ionized condition upon being introduced into the vacuum chamber. The at least one further reactive gas which can be introduced into the vacuum chamber during the procedure for deposit of the coating system according to the invention can advantageously also already be in an ionized condition upon being introduced into the vacuum chamber.

For the purposes of depositing the coatings according to the invention it is provided that at least one respective target of aluminum and/or a target of zirconium is arranged in the vacuum chamber. Alternatively it is possible, in place of a target of aluminum and a target of zirconium, to use an alloy consisting of aluminum and zirconium as the target. The advantage of that use of the targets in alloy form is the use of a solid alloy composition for the metal components and the greater ease of controlling the manufacturing procedure.

In addition, in accordance with the invention, an additional target comprising at least one further material, preferably an element from Groups IVa–VIa, Ib–IVb of the periodic system, can be arranged in the vacuum chamber. The invention also envisages the use of an alloy comprising at least two of those elements.

Zirconium-silicon or zirconium-boron or alloys comprising molybdenum and/or tungsten are referred to here by way of example.

Deposit of the coating is usually effected by way of magnetic field-assisted cathodic sputtering, with at least one sputtering cathode being regulated in a dc mode, a pulsed dc mode or in a HF or RF mode. When using electrically conductive materials or alloys the target cathodes are preferably operated in the dc mode, while other alloys are operated in the pulsed dc mode. Non-conducting targets are regulated in the HF or RF mode. The procedure for deposit of the coating according to the invention can also be implemented by means of an arc, light arc, ion beam or electron beam vaporization method.

The layers according to the invention which are produced by the process according to the invention can be used for at least partial surface coating of materials. The materials that can be used in this respect include steel, aluminum, magnesium or copper alloys, silicon or silicon-bearing materials, glass, ceramic, plastic material or sintered hard substances, preferably carbide or cermet or fiber-reinforced glass. In particular such articles involve mold tools for processing plastic material, rubber, caoutchouc or glass, tools for wood or aluminum working, medical or surgical instruments, components for machines, engines, motors or automobiles, electrical or electronic components, ornaments such as jewelry or utility articles such as utensils and like commodities. In that respect, it is immaterial whether the parts to be so coated are individual parts, composite parts or the entire parts of the above-indicated products.

The laminate system according to the invention comprising the at least one coating can also advantageously be deposited on a component or member which is already coated with any suitable layer, so that, depending on the atomic ratio of aluminum to zirconium the properties of a high level of chemical resistance and/or a low level of tendency to adhesion can be applied to any desired workpiece.

EXAMPLE

A layer or laminate system based on aluminum, zirconium and nitrogen, which can be put to use for at least partial surface coating on a material, workpiece or like item. can be produced by a deposit process wherein an electrical gas discharge is fired to form a plasma enriched with noble gas, for ionization of aluminum and/or zirconium, in a vacuum chamber. To form the nitrides of the aluminum and/or zirconium, nitrogen is continuously supplied and removed in the appropriate fashion to adjust a reactive gas partial pressure as a controllable parameter for controlling the deposit procedure.

The system produced by that process has at least one layer which comprises covalent bonds of aluminum nitride or bonds of aluminum nitride and zirconium nitride.

It will be appreciated that the above-outlined composition of the system according to the invention and the operating procedure for producing same have been set forth solely by way of example and illustration of the invention and that various modifications and alterations may be made therein without thereby departing from the spirit and scope of the invention.

What is claimed is:

1. A laminate system with a thickness of at least 50 nm up to 6 μm and wherein at least one layer of the laminate system consists of covalently bonded Al—Zr—N with an atomic ratio of Al:Zr$\leq$1.

2. A laminate system of claim 1 wherein the atomic ratio of Al:Zr is between 0.5 and 0.7.

3. A method of using a laminate system according to claim 2 for at least a partial surface coating of a material.

4. A laminate system of claim 1 wherein the atomic ratio of Al:Zr.

5. A method of using a laminate system according to claim 4 for at least a partial surface coating of a material.

6. A laminate system of claim 1 wherein the atomic ratio of Al:Zr is between 0.25 to 0.45.

7. A method of using a laminate system according to claim 6 for at least a partial surface coating of a material.

8. A method of using a laminate system according to claim 1 for at least a partial surface coating of a material.

* * * * *